US012400707B2

(12) United States Patent
Dhori (10) Patent No.: US 12,400,707 B2
(45) Date of Patent: Aug. 26, 2025

(54) DEVICE AND METHOD FOR READING DATA FROM MEMORY CELLS (71) Applicant: STMicroelectronics International N.V., Geneva (CH)

(72) Inventor: Kedar Janardan Dhori, Ghaziabad (IN)

(73) Assignee: STMicroelectronics International N.V., Geneva (CH)

(*) Notice: Subject to any disclaimer, the term of this patent is extended or adjusted under 35 U.S.C. 154(b) by 263 days.

(21) Appl. No.: 17/494,683

(22) Filed: Oct. 5, 2021

(65) Prior Publication Data
US 2022/0122657 A1 Apr. 21, 2022

Related U.S. Application Data (60) Provisional application No. 63/092,305, filed on Oct. 15, 2020.

(51) Int. Cl.
G11C 11/419 (2006.01)
G11C 11/412 (2006.01)
G11C 11/418 (2006.01)

(52) U.S. Cl.
CPC .......... *G11C 11/419* (2013.01); *G11C 11/412* (2013.01); *G11C 11/418* (2013.01)

(58) Field of Classification Search
CPC .... G11C 11/418; G11C 11/419; G11C 11/412
USPC ......................................................... 365/156
See application file for complete search history.

(56) References Cited

U.S. PATENT DOCUMENTS

| 5,590,087 A | * | 12/1996 | Chung | G11C 8/16 365/49.1 |
| 6,944,066 B1 | | 9/2005 | Jing | |
| 8,625,373 B2 | | 1/2014 | Schreiber | |
| 8,792,267 B1 | | 7/2014 | Chandwani et al. | |
| 9,165,619 B2 | * | 10/2015 | Song | G11C 7/12 |
| 10,446,201 B2 | | 10/2019 | Goel et al. | |
| 11,094,355 B1 | * | 8/2021 | Simon | G11C 7/065 |
| 2007/0133313 A1 | * | 6/2007 | Kim | G11C 7/1066 365/207 |
| 2008/0316840 A1 | * | 12/2008 | Kim | G11C 7/1096 365/208 |
| 2012/0317374 A1 | * | 12/2012 | Chen | G11C 7/18 711/E12.001 |
| 2020/0405254 A1 | * | 12/2020 | Kunieda | A61B 6/542 |

FOREIGN PATENT DOCUMENTS

| CN | 103594107 A | 2/2014 |
| CN | 105719689 A | 6/2016 |
| CN | 110660430 A | 1/2020 |

* cited by examiner

Primary Examiner — Sung Il Cho
(74) Attorney, Agent, or Firm — Seed Intellectual Property Group LLP (57) ABSTRACT An integrated circuit includes a memory array. The memory array includes a plurality of bitlines. The bitlines are each coupled to a respective local I/O circuit. All of the local I/O circuits are coupled to a global I/O circuit. Each local I/O circuit includes a first sensing stage for reading data from the memory cell. The global I/O circuit includes a second sensing stage for reading data from the memory cell.

18 Claims, 7 Drawing Sheets

DEVICE AND METHOD FOR READING DATA FROM MEMORY CELLS

BACKGROUND

Technical Field

The present disclosure relates to the field of integrated circuit memory cells. The present disclosure relates more particularly to read operations of memory cells.

Description of the Related Art

Integrated circuits often include arrays of memory cells. For many integrated circuits, it is beneficial for memory read and write operations to be performed at higher speed as this affects system-on-chip (SoC) performance. However, factors such as parasitic capacitance in bitlines can limit the speed of memory read and write operations. Efforts to reduce the negative effects of parasitic capacitance typically lead to other drawbacks.

BRIEF SUMMARY

In one or more embodiments, the present disclosure provides an integrated circuit including a multi-port memory cell configured to store a data value. The integrated circuit includes a plurality of bitlines each coupled to the multiport memory cell. The integrated circuit includes a plurality of local I/O circuits each coupled to a respective bitline and including a first sensing stage configured to sense the data value from the bitline when the bitline is selected for a read operation. The integrated circuit includes a global I/O circuit coupled to each of the local I/O circuits. The global I/O circuit includes a global bitline that can be selectively coupled to receive the data value from the local I/O circuit coupled to the bitline selected for the read operation. The global I/O circuit includes a second sensing stage including an evaluation circuit configured to sense the data value on the global bitline.

In one or more embodiments, an integrated circuit includes a memory array having a plurality of banks of memory cells and a plurality of local I/O circuits each coupled to a respective bank of memory cells and including a first sensing stage configured to sense a data value from the respective bank of memory cells when the bank of memory cells is selected for a read operation. The integrated circuit includes a global I/O circuit coupled to each of the local I/O circuits. The global I/O circuit includes a global bitline that can be selectively coupled to receive the data value from the local I/O circuit coupled to the bank of memory cells selected for the read operation. The global I/O circuit includes a second sensing stage including an evaluation circuit configured to sense the data value on the global bitline.

In one or more embodiments, a method includes storing a data value in a memory cell, selecting the memory cell for a read operation, and outputting the data value to a bitline coupled to the memory cell. The method includes sensing the data value from the bitline with a local I/O circuit coupled to the bitline, providing the data value from the local I/O circuit to a global I/O circuit by selectively enabling the local I/O circuit, and sensing the data value with the global I/O circuit and outputting the data value from the global I/O circuit.

DETAILED DESCRIPTION

Figure 1:
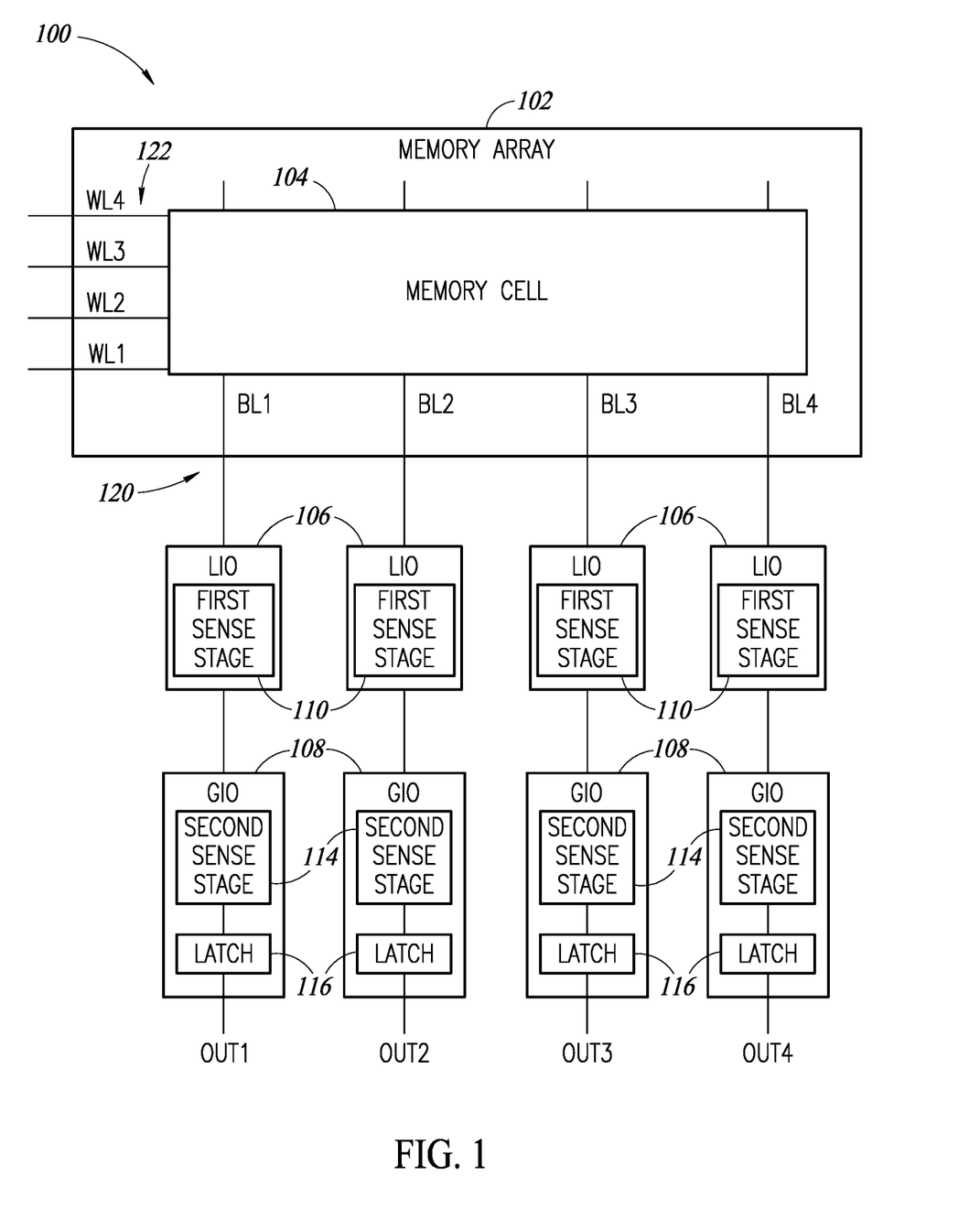
FIG. 1 is a block diagram of an integrated circuit including a memory array, according to one or more embodiments.

FIG. 1 is a block diagram of an integrated circuit 100, according to one or more embodiments. The integrated circuit 100 includes a memory array 102. The memory array 102 can include a plurality of memory cells 104. For simplicity, FIG. 1 illustrates only a single memory cell 104. The integrated circuit 100 further includes local I/O (LIO) circuits 106 and—global I/O (GIO) circuits 108. As will be set forth in more detail below, the LIO circuits 106 and the GIO circuits 108 are configured to enable rapid read operations of the memory cells 104 while reducing the area used in comparison to traditional I/O circuits.

In some embodiments, the memory cell 104 is a multiport memory cell. A multiport memory cell is a memory cell that can output data to multiple ports. In one example, the integrated circuit 100 includes a multicore processor (not shown). Each core of the processor may read data from a same memory cell. Accordingly, the memory cell may be connected to a separate bitline for each core. This is one example of a multiport memory cell.

The integrated circuit includes a group 120 of four bitlines, BL1-BL4. Each of the four bitlines BL1-BL4 is utilized to read data from the memory cell 104 to one of four separate ports. Additionally, the integrated circuit 100 includes a group 122 of four word lines, WL1-WL4. Data can be read from the memory cell 104 to one of the ports by selecting one of the bitlines BL1-BL4 and one of the word lines WL1-WL4. For example, if data is to be read from the memory cell 104 to a first port, then the bitline BL1 and the word line WL1 will be selected.

In some embodiments, the integrated circuit includes a respective LIO circuit 106 for each bitline. In the example of FIG. 1, there are four bitlines. Accordingly there are four LIO circuits 106. Each of the LIO circuits 106 are identical to each other. Each LIO circuit 106 includes a first sense stage 110. The first sense stage 110 performs a first sense operation of the corresponding bitline when that bitline is selected for a read operation of the memory cell 104.

Each of the LIO circuits 106 is coupled to a respective GIO circuit 108. When a read operation is performed for one of the bitlines, the corresponding LIO circuit 106 senses the data on the bitline and passes the sensed data value, or its logical compliment, to the respective GIO circuit 108. The GIO circuit 108 then senses the data value provided from the LIO circuit 106 and outputs the data value to the corresponding output port OUT1-OUT4.

Each GIO circuit 108 includes a second sense stage 114 and a latch 116. The second sense stage 114 senses the data value received from the LIO circuit 106. The second sense stage 114 provides the data value to the latch 116. The latch 116 latches the output OUT of the GIO circuit 108 at the data value sensed by the second sense stage 114. In this manner, a GIO circuit 108 receives a data value from an LIO circuit 106 and outputs the data value. Receiving the data value from the LIO circuit 106 can include receiving a logical complement of the data value.

It is possible that the integrated circuit 100 can include a large number of LIO circuits 106. In the case of multiport memory cells, there may be multiple LIO circuits 106 for each column of memory cells in the array of memory cells 102. If there are four ports per memory cell, then there may be four LIO circuits 106 for each column of memory cells in the memory array 102. Furthermore, in some cases a memory array 102 may include multiple banks of memory cells in order to reduce parasitic capacitance between bitlines, as will be explained in more detail below in relation to FIG. 3. The bank configuration breaks each column of memory cells into two or more groups of bitlines. A first half of a column may have a first set of bitlines. The second half of a column may have a second set of bitlines. The integrated circuit may include LIO circuits 106 for each bitline of both sets. Accordingly, there may be a large number of LIO circuits 106 for memory array banking configurations.

One possible solution for reading data from memory cells in multiport or banked configurations, is to include, in each LIO circuit, a complex logic circuit that senses the data from the respective bitline. However, this solution results in a large area usage of the integrated circuit. This is because each LIO circuit would include the complex logic circuit to sense the data from the corresponding bitline. If there is a large number of ports, banks, or both, then the area collectively consumed by the LIO circuits 106 can become quite large.

Embodiments of the present disclosure overcome the area penalty drawbacks of other solutions by providing sensing stages in both the LIO circuits 106 and the GIO circuits 108. In particular, the LIO circuits 106 each include a first sense stage 110 that is very simple and consumes a very small amount of area. The GIO circuit 108 includes a more complex second sense stage 114.

The LIO circuits 106 and GIO circuits 108 can also be utilized in banked memory array configurations, as will be described in more detail in relation to FIG. 3. Accordingly, an integrated circuit 100 including the LIO circuits 106 and the GIO circuit 108 as described in relation to FIG. 1 and subsequent figures, provides reliable multiport or banked memory sensing while consuming less area compared to other solutions.

Figure 2:
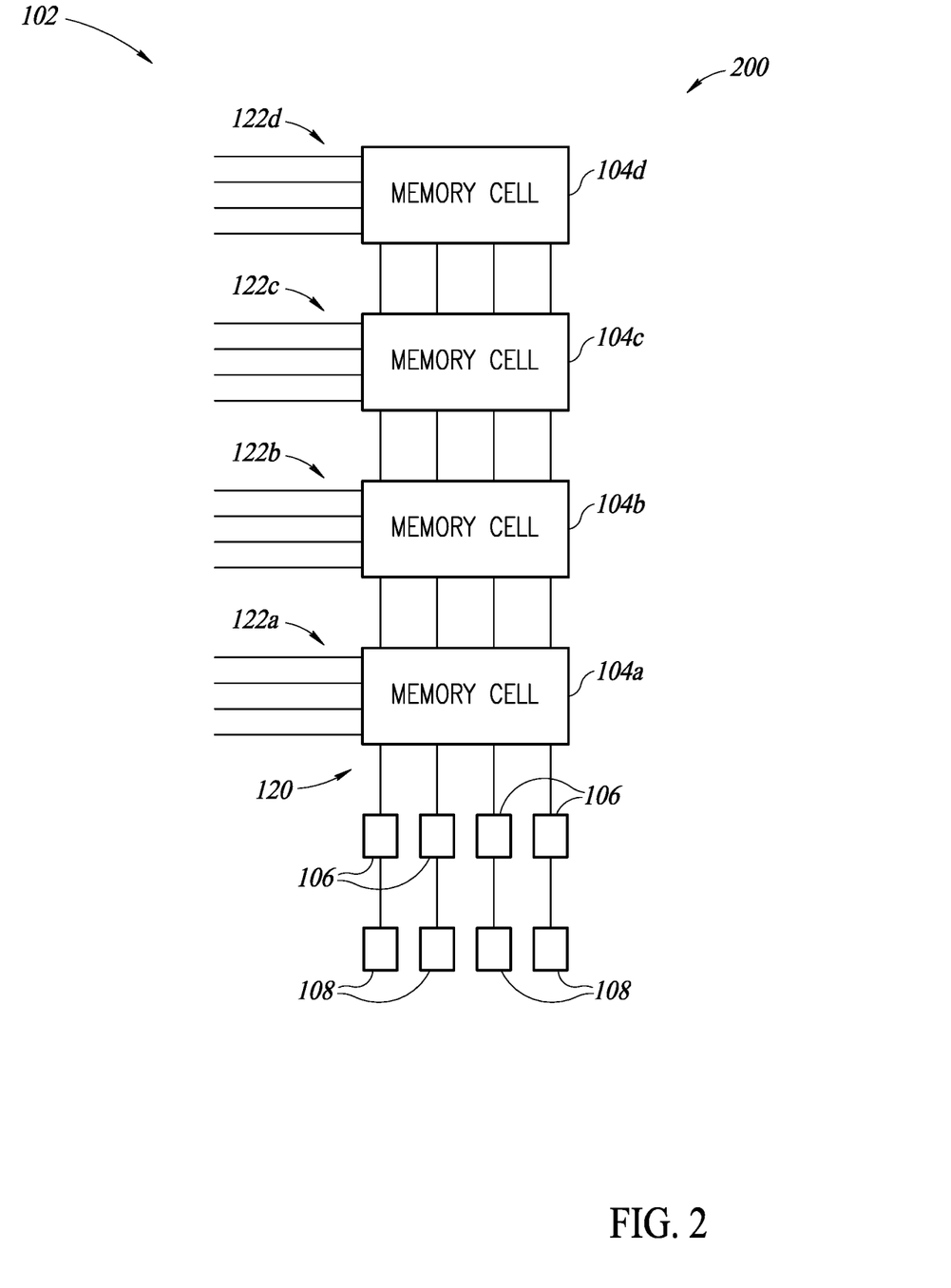
FIG. 2 is a block diagram of a memory array including multiport memory cells, according to one or more embodiments.

FIG. 2 is a block diagram of a portion of a memory array 102 of an integrated circuit 200, according to one embodiment. In particular, FIG. 2 illustrates a single column of memory cells. The column of memory cells includes four memory cells 104a-104d. In practice, there may be many more memory cells than four in each column in memory cells. The memory array 102 includes a group of bitlines 120. In this case, the memory array 102 is a multiport memory array such that there are multiple bitlines for each column of memory cells. The memory array 102 includes, for each row of memory cells, a respective group of word lines 122a-122d.

The integrated circuit 200 includes, for each bitline, a respective LIO circuit 106 as described in relation to FIG. 1. The LIO circuits 106 of FIG. 2 can be substantially identical to those shown in FIG. 1, including first sense stages 110. The integrated circuit 200 also includes a plurality of GIO circuits 108. The GIO circuits 108 of FIG. 2 can be substantially the same as the GIO circuits 108 of FIG. 1, including the second sense stage 114. The bitlines 120, the word lines 122a-122d, the LIO circuits 106, and the GIO circuits 108 cooperate to perform read operations from the memory cells 104a-104d.

Figure 3:
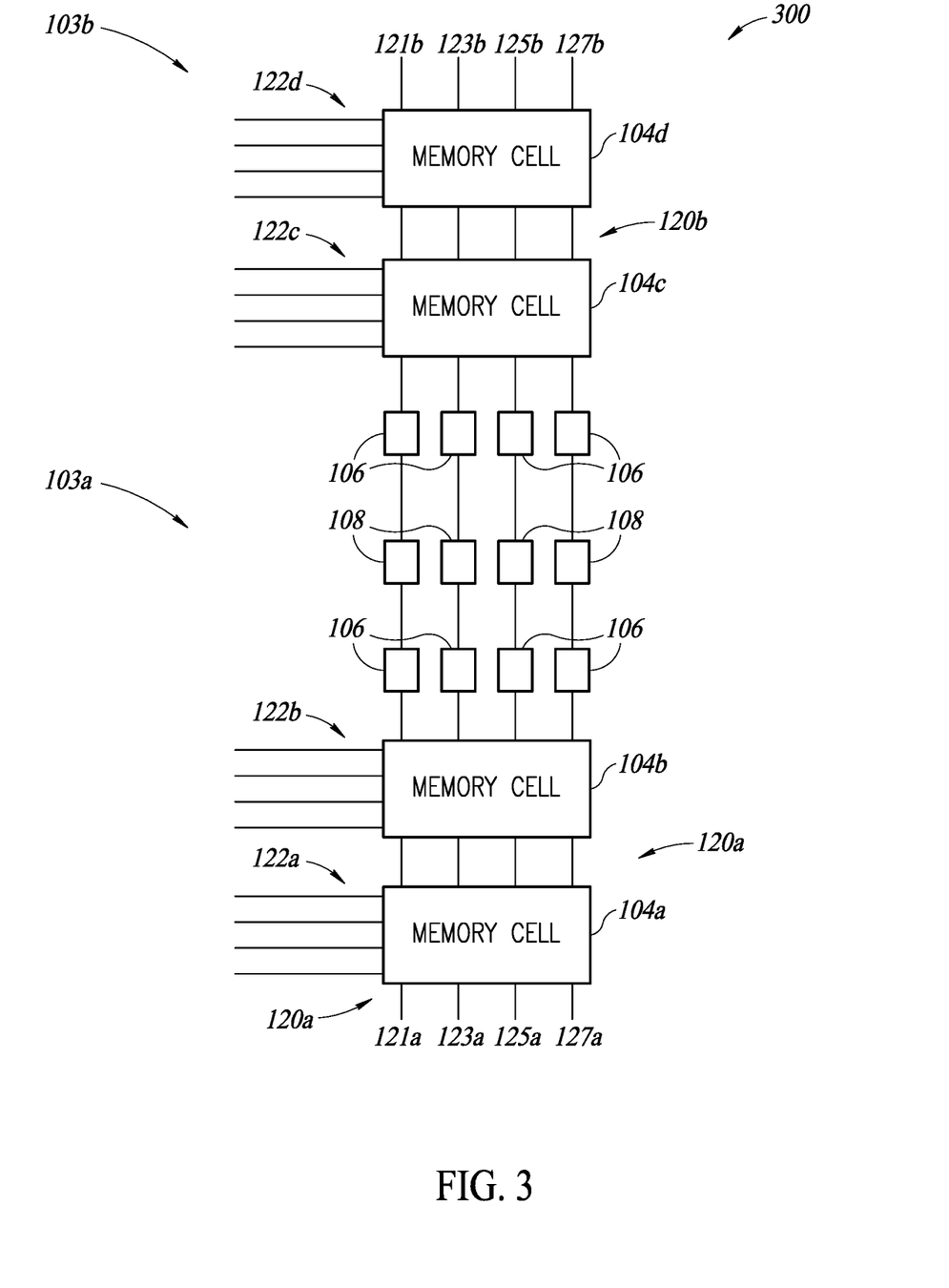
FIG. 3 is a block diagram of a memory array in the banking configurations, according to one or more embodiments.

FIG. 3 is a block diagram of a portion of a memory array 102 of an integrated circuit 300, according to one embodiment. In FIG. 3, the memory array is in a banked configuration. In the banked configuration, the memory array 102 is divided into two banks or sub arrays of memory cells.

As mentioned previously, when each column of memory cells includes a large number of memory cells, the bitline or bitlines (in a multiport configuration) for a column of memory cells may become very long. The length of the bitlines can result in a very large parasitic capacitance between the bitlines. In one example, an array of memory cells can include 512 rows of memory cells. Accordingly, each column of memory cells would include 512 memory cells. To reduce the length of the bitlines, the memory array 102 is divided into two or more banks. In the bank configuration, half of the memory cells of each column are in the first bank 103a and the other half of the memory cells of each column are in the second bank 103b. The result is that the lengths of the bitlines is halved compared to a non-banked configuration. This greatly reduces the parasitic capacitance between the bitlines. Furthermore, each bank 103a, 103b may include a large number of columns of memory cells. There may be more than two banks of memory cells without departing from the scope of the present disclosure.

In the example of FIG. 3, a first group 120a bitlines is coupled to the memory cells 104a and 104b of the first bank of memory cells 103a. A second group 120b of bitlines is coupled to the memory cells 104c and 104d of the second bank of memory cells 103b. In practice, there may be many more than two memory cells in each column in each bank of memory cells. For example, there may be 256 or more memory cells in each column in each bank of memory cells.

The first group 120a of bitlines includes a bitline 121a, a bitline 123a, a bitline 125a, and a bitline 127a. The second group 120b of bitlines includes a bitline 121b, a bitline 123b, a bitline 125b, and a bitline 127b. The banked memory array results in a single bitline being separated into two bitlines. For example, bitlines 121a and 121b would be a continuous single bitline if the memory array was not banked. Because the memory array is banked, the bitlines can be considered as segmented bitlines. Bitlines 121a and 121b are a singled segmented bitline. Bitlines 123a and 123b are a singled segmented bitline. Bitlines 125a and 125b are a singled segmented bitline. Bitlines 127a and 127b are a singled segmented bitline. Each of the bitlines from the group 120a is coupled to a respective LIO circuit 106. Each of the bitlines from the group 120b is coupled to a respective LIO circuit 106.

There is a single GIO circuit 108 associate with each segmented bitline. Accordingly, the LIO circuits coupled to the bitlines 121a and 121b are coupled to a single GIO circuit 108. The two LIO circuits 108 coupled to the bitlines 123a and 123b are coupled to a single GIO circuit 108. The LIO circuits 106 coupled to the bitlines 125a and 125b are coupled to a single GIO circuit 108. The LIO circuits 106 coupled to the bitlines 127a and 127b are coupled to a single GIO circuit 108.

As can be seen in the example of FIG. 3, the number of LIO circuits 106 can become quite large for banked memory arrays of multiport memory cells. Additionally there may be a large number of columns of memory cells in each bank of memory cells, further increasing the number of LIO circuits 106. Accordingly, the LIO circuits 106 and the GIO circuit 108 as described in relation to FIG. 1 provide large area savings by moving more complex sense circuitry from the LIO circuits 106 to the GIO circuits 108 because there are fewer GIO circuit 108 than LIO circuits 106. If the memory array includes four banks instead of two, each segmented bitline will include 4 bitlines and each GIO circuit 108 will be coupled to four LIO circuits 106. Because increasing the number of memory banks does not increase the number of GIO circuits 108, the area savings resulting from moving complex circuitry from the LIO circuits 106 to the GIO circuits 108 increases with the increasing number of memory banks.

Figure 4:
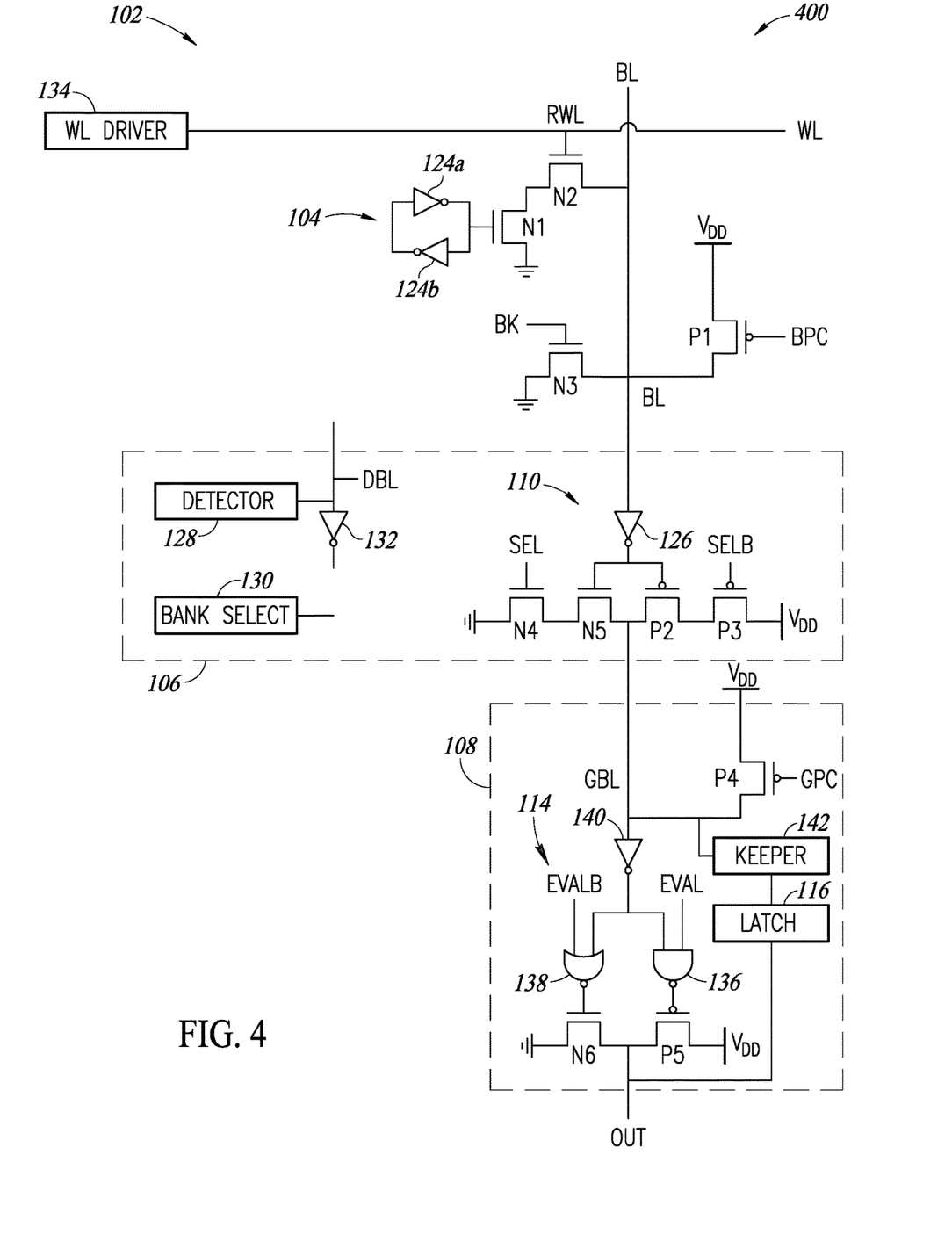
FIG. 4 is a schematic diagram of memory reading circuitry of an integrated circuit, according to one or more embodiments.

FIG. 4 is a schematic diagram of an integrated circuit 400 including a memory array 102, according to one embodiment. FIG. 4 illustrates only a single memory cell 104 of the memory array 102. In the example of FIG. 4, the memory cell 104 is an SRAM memory cell including two cross coupled inverters 124a, 124b, though other types of memory cells can be utilized without departing from the scope of the present disclosure. For simplification only 1 Read port and latch element of a t 6T SRAM cell is shown (pass transistors of 6T element are not shown). Similarly only one LIO 106 and GIO 108 circuit associated to only 1 port is shown in FIG. 4.

A single bitline BL is coupled to the memory cell 104 via the NMOS transistors N1 and N2. In the example of FIG. 4, the memory array 102 may be a banked memory array in which the memory array 102 is divided into multiple banks. Each column of memory cells in each bank may be coupled to a single bitline, or multiple bitlines through a multiplexer. Each bitline is coupled to an LIO circuit 106. A single word line WL is coupled to the gate of the transistor N2 and can drive multiple columns based on the size of the memory array. The word line WL is connected to a word line driver 134. And for simplification only one bitcell of a column is shown connect to single bitline.

The bitline BL is coupled to the drain terminal of the PMOS transistor P1 and to the drain terminal of the NMOS transistor N3. The gate of the PMOS transistor P1 receives a bitline precharge signal BPC. The gate of the NMOS transistor N3 receives a bitline keep signal BK. The source of the PMOS transistor P1 is coupled to the high supply voltage VDD. The source of the NMOS transistor N3 is coupled to ground.

The LIO circuit 106 includes a first sense stage 110. The first sense stage 110 includes an inverter 126 and an arrangement of NMOS transistors N4, N5 and PMOS P2 and P3. The input of the inverter 126 is coupled to the bitline BL. The output of the inverter 126 is supplied to the gate terminals of the transistors N5 and P2. The gate of the transistor N4 receives a selection signal SEL. The gate of the transistor P3 receives the selection signal SELB, which is the logical complement of SEL. The source terminal of the transistor P3 is coupled to VDD. The source terminal of the transistor N4 is coupled to ground.

The LIO circuit 106 includes a precharge detector 128 coupled to a dummy bitline DBL and dummy inverter 132. Dummy circuit elements can be shared across various bitlines of a same port. The LIO circuit 106 also includes a select circuit 130 that generates the selection signals SEL and SELB. The output of the LIO circuit 106 is the drain terminals of the transistors N5 and P2. The output of the LIO circuit 106 is coupled to the GIO circuit 108.

The GIO circuit 108 (shown for 1 port and 1 global bitline) includes a global bitline GBL and a second sense stage 114. The second sense stage 114 includes an inverter 140, a NOR gate 138, and a NAND gate 136. The second sense stage 114 also includes NMOS transistor N6 and PMOS transistor P5. The global bitline GBL is coupled to the output of the LIO circuit 106 into the input of the inverter 140. The global bitline GBL is also coupled to the keeper circuit 142 and to the drain terminal of the PMOS transistor P4. The gate terminal of the transistor P4 receives a global precharge signal GPC. The source of the transistor P4 is coupled to VDD.

The output of the inverter 140 is coupled to an input of the NOR gate 138 and the NAND gate 136. A second input of the NAND gate 136 receives an evaluation signal EVAL. A second input of the NOR gate 138 receives an evaluation signal EVALB, which is the logical complement of EVAL. The output of the NAND gate 136 is coupled to the gate terminal of the PMOS transistor P5. The output of the NOR gate 138 is coupled to the gate of the transistor N6. The source of the transistor N6 is coupled to ground. The source of the transistor P5 is coupled to VDD. The drain terminals of the transistors N6 and P5 are coupled together and correspond to the output terminal OUT of the GIO circuit 108. The GIO circuit 108 also includes a latch 116 that latches the output terminal of the GIO circuit 108 at the most recent value supplied at the drain terminals of the transistors N6 and P5.

The latch 116 is coupled to the keeper circuit 142.

Figure 5:
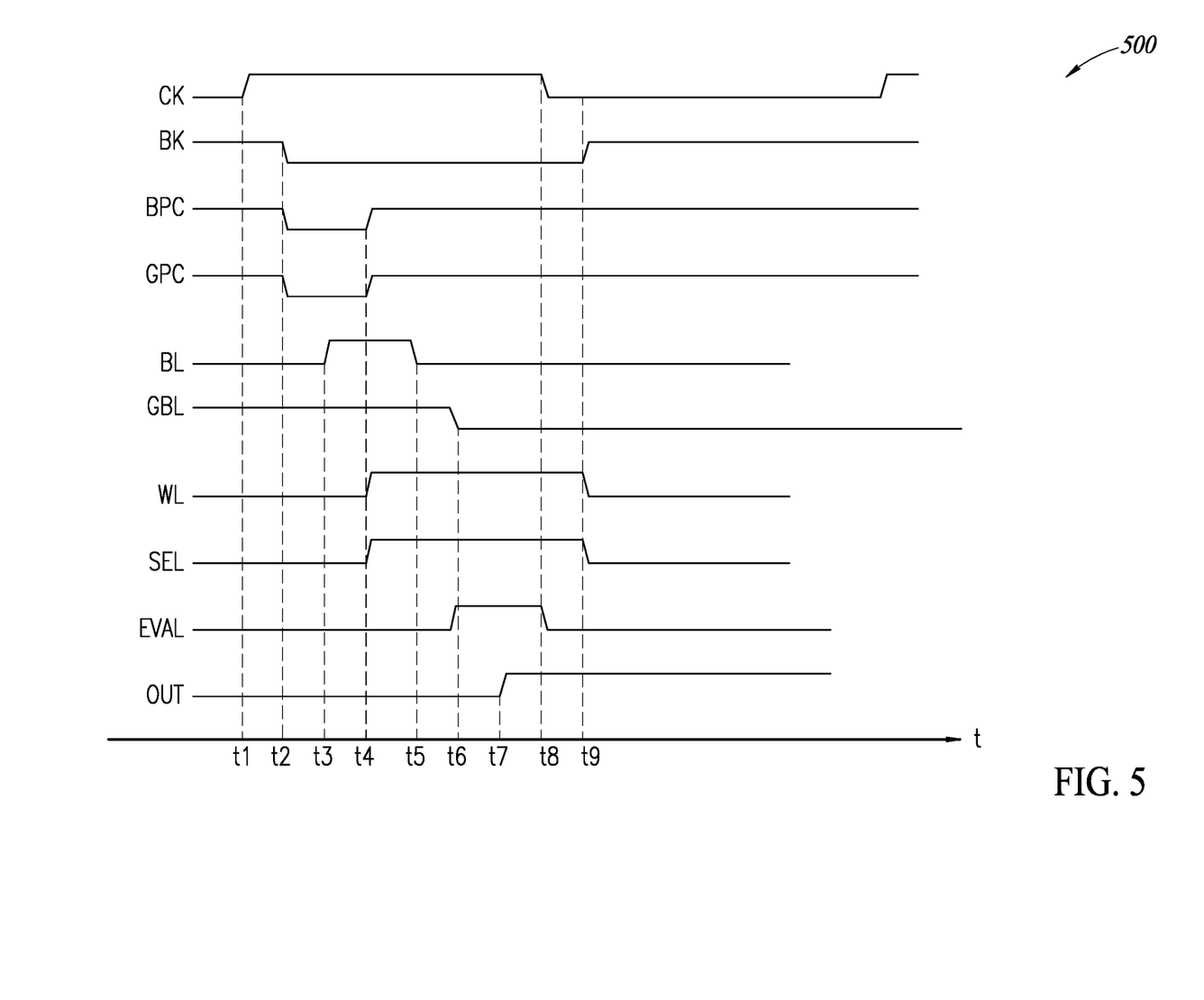
FIG. 5 is a timing diagram of signals related to a memory read operation, according to one or more embodiments.

FIG. 5 is a timing diagram 500 illustrating the timing of various signals generated during a read operation of the memory cell 104 of FIG. 4, according to one embodiment. The operation of the circuitry of FIG. 4 will be described jointly with the description of FIG. 5.

FIG. 5 illustrates a clock signal CK. At time t1, the clock signal CK transitions from a low logic level to a high lodging value. The rising edge of the clock signal CK causes the bitline keep signal BK, the bitline precharge signal BPC, and the global bitline precharge signal GPC to transition from a high logic level to a low logic level (e.g. ground) at time t2 in preparation for a read operation of the memory cell 104. As used herein, the high logic level may correspond to the supply voltage VDD. The low logic level may correspond to ground.

When BK goes low, the transistor N3 is turned off, thereby decoupling the bitline BL from ground. When BPC goes low, the transistor P1 is turned on, thereby coupling the bitline BL to VDD. This precharges the bitline BL to VDD in preparation for the read operation. When GPC goes low, the transistor P4 is turned on, thereby coupling the global bitline GBL to VDD. This precharges the global bitline GBL to VDD in preparation for a read operation.

At time t3 the bitline BL is precharged to VDD because the bitline precharge signal BPC has caused the bitline to be coupled to VDD. In practice, the bitline BL will begin to increase toward VDD as soon as the transistor P1 is turned on by BPC. The charging of the bitline BL also causes the charging of the dummy bitline DBL. The charging of the dummy bitline DBL is detected by the detector 128. The circuit operates under the assumption that if the dummy bitline DBL has reached VDD, then the bitline BL will also have reached VDD. Accordingly, the detector 128 vicariously senses when the bitline BL is precharged by sensing when the dummy bitline DBL is precharged.

At time t4 BPC and GPC transition from the low logic level to the high logic level responsive to the detector 128 detecting that the dummy bitline is precharged. When BPC and GPC transition to the high logic level, the transistors P1 and P4 are turned off. This decouples the bitline BL and global bitline GBL from VDD.

At time t4, the word line WL and the selection signal SEL go high responsive to the detector 128 detecting that the dummy bitline DBL is precharged. The word line driver 134 drives the word line WL to VDD. The bank select circuit 130 drives SEL to VDD. When the word line WL goes high, the transistor N2 is turned on. Depending on the value of the data stored in the memory cell 104, the bitline BL will either transition to the low logic level or remain at the high logic level. The value of the data stored in the memory cell 104 corresponds to the voltage at the output of the inverter 124a. If the data value is 1 (VDD) then the transistor N1 is conducting and the bitline BL is coupled to ground via N1 and N2 (because WL is high). If the data value is 0 (ground), then the transistor N1 is not conducting and the bitline BL is not coupled to ground. In this case, the bitline BL remains at the high logic level from the precharge.

In the example of FIG. 5, the value stored in the memory cell is 1. Accordingly, the bitline BL is coupled to ground and at time t5 the bitline has transitioned to ground. When the bitline BL goes to ground, the input of the inverter 126 of the LIO circuit 106 goes to ground. The output of the inverter 126 goes high. Because the output of the inverter 126 is high, the transistor P2 becomes nonconducting and the transistor N5 becomes conducting. Because the selection signal SEL is high, the transistor N4 is conducting. Because the complementary selection signal SELB is low the transistor P3 is conducting. Because P2 is not conducting, the drains of P2 and N5 are decoupled from VDD. Because N4 and N5 are conducting, the drains of P2 and N5 are coupled to ground. Accordingly, the output of the LIO circuit 106 is ground (low logic level). The operation of the first sense stage 110 corresponds to a first sense operation. The first sense operation senses the data value stored in the memory cell 104 by sensing the complement of the data value stored in the memory cell 104.

At time t6, the global bitline GBL transitions to the low logic level. This is because, as explained above, the output of the LIO circuit 106 has transitioned to the low logic level. It should be noted, that, in practice, the global bitline GBL is coupled to the output of all of the LIO circuits 106 coupled to the various bitlines of the memory array 102. However, the transistors N4 and P3 of the other LIO circuits 106 are not conducting because for them, SEL is low because they are not selected for the read operation. Only one LIO circuit 106 at a time is selected for the read operation. In this case, the LIO circuit 106 shown in FIG. 4 is selected for the read operation. The select circuit 130 of the non-selected LIO circuits 106 output SEL at a low value.

At time t6, the evaluation signal EVAL goes high. The evaluation signal EVAL goes high responsive to the word line WL going high but with a delay. The value of the delay is selected to ensure that the global bitline GBL receives the data value (in this case the complement) stored in the memory cell 104. In practice, the evaluation signal EVAL may go high slightly before or slightly after t6.

When GBL goes low at time t6, the input of the inverter 140 receives the low logic level. Accordingly, the output of the inverter 140 provides the high logic level. The NAND gate 136 receives the high EVAL signal and the high logic level from the inverter 140. Accordingly, the NAND gate 136 outputs the low logic level. The NOR gate 138 receives the low EVALB signal and the high logic level from the inverter 140. Accordingly, the NOR gate 138 outputs a low logic level. The low logic level output by the NOR gate 138 turns off the transistor N6, thereby decoupling the drain terminals of the transistors N6 and P5 from ground. The low-voltage output by the NAND gate 136 turns on the transistor P5, thereby coupling the drain terminals of the transistors N6 and P5 to VDD. Because the output OUT of the GIO circuit 108 is coupled to the drain terminals of the transistors N6 and P5, the output of the GIO circuit 108 is the high logic level at time t7. This is the value stored in the memory cell 104. The latch 116 latches the output OUT of the GIO circuit 108 to this value. At t8, the evaluation signal EVAL transitions from the high logic level to the low logic level (managed by an internal delay). However, because the latch 116 has latched the output of the GIO circuit 108 at the most recent value, the output OUT of the GIO circuit 108 remains at the high logic level.

At time t9 the bitline keeper signal BK transitions to the high logic level, timed internally. Similarly, the word line driver 134 drives the word line WL to the low logic level and also the bank select circuit 130 drives the selection signal SEL to the low logic level. The bitline BL is coupled to ground because the transistor N3 is now turned on. Accordingly, the bitline BL is brought to ground after every read operation. To the contrary, the global bitline GBL is not brought to ground after every read operation. Instead, the global bitline GBL is kept by the keeper circuit 142 at the most recent value between read cycles.

Figure 6:
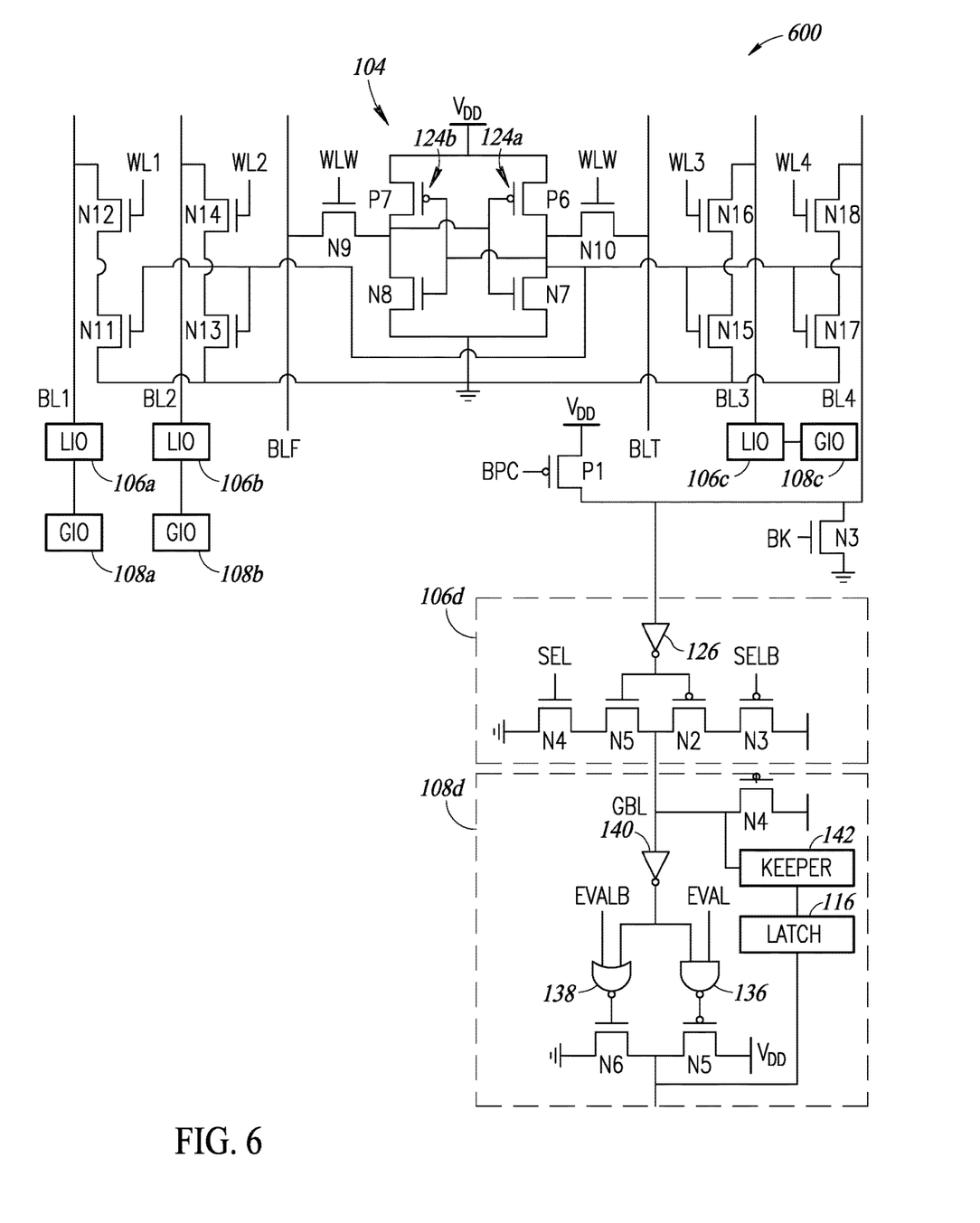
FIG. 6 is a schematic diagram of memory reading circuitry of an integrated circuit, according to one or more embodiments.

FIG. 6 is a schematic diagram of an integrated circuit 600 including a multiport memory cell 104. The multiport memory cell 104 is an SRAM memory cell including cross coupled inverters 124a, 124b. Four bitlines BL1-BL4 and four word lines WL1-WL4 are coupled to the memory cell 104.

The inverter 124a includes the PMOS transistor P6 and the NMOS transistor N7 having gate terminals and drain terminals coupled together. The inverter 124b includes the PMOS transistor P7 and the NMOS transistor N8 having gate and drain terminals coupled together. The source terminals of the transistors P7 and P6 are coupled to VDD. The source terminals of the transistors N8 and N7 are coupled to ground. The drain terminals of the transistors P6 and N7 correspond to the output of the memory cell 104 driving the gate terminals of N11, N13, N15 and N17. Accordingly, the value of the data stored in the memory cell 104 is the logic level at the drain terminals of the transistors P6 and N7.

The NMOS transistor N9 is coupled between the output of the inverter 124b and the false bitline BLF. The NMOS transistor N10 is coupled between the output of the inverter 124a and the true bitline BLT. The gate terminals of the transistors N9 and N10 receive a word line write signal WLW for writing data to the memory cell 104. Accordingly, N9, N10, BLF and BLT are utilized only in write operations of the memory cell 104.

The NMOS transistors N11, N13, N15, and N17 have source terminals coupled to ground and gate terminals coupled to the output of the memory cell 104. The NMOS N12, N14, N16, and N18 are coupled between a respective bitline BL1-BL4 and a respective one of the transistors N11, N13, N15, and N17. The gate terminals of N12, N14, N16, and N18 are coupled to a respective word line WL1-WL4. The pair of transistors coupled to the bitlines BL1-BL4 perform the same function as the transistors N1 and N2 described in relation to FIGS. 4 and 5.

Each bitline BL1-BL4 is coupled to a respective LIO circuit 106a-106d. The LIO circuits 106a-106d are identical to each other. Only the LIO circuit 106d coupled to the bitline BL4 is shown in detail in FIG. 6. The LIO circuits 106a-106d are identical to the LIO circuit 106 of FIG. 4. Each of LIO circuits 106a-106d is connected to a global bitline of a respective GIO circuit 108. The LIO circuits 106a-106d and the GIO circuits 108a-108d of FIG. 6 function substantially identical to the LIO circuit 106 and GIO circuit 108 shown and described in relation to FIGS. 4 and 5.

When data is to be read from the memory cell 104 to one of the ports, the corresponding wordline and bitline are selected. The selected wordline driver drives the wordline high. The selected bitline is precharged in preparation for the read operation, as described in relation to FIGS. 4 and 5. The corresponding LIO 106 receives the high SEL signal and the data from the memory cell is sensed by the first sense stage 110 and passed to the global bitline GBL of the GIO circuit 108, as described in relation to FIGS. 4 and 5. The GIO circuit 108 senses the data value on the global bitline GBL and outputs the data value at the output OUT, as described in relation to FIGS. 4 and 5.

Figure 7:
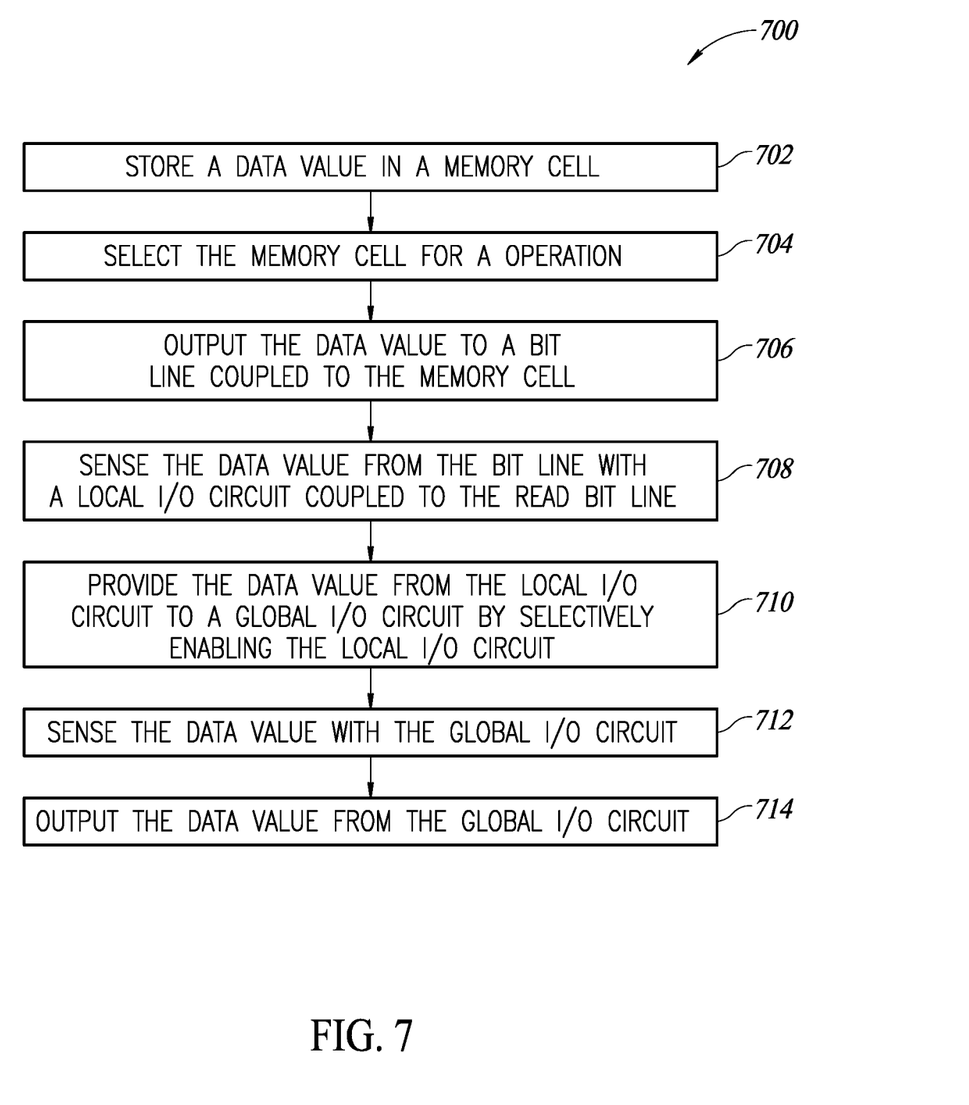
FIG. 7 is a flow diagram of a method for reading data from a memory cell from an integrated circuit, according to one embodiment.

FIG. 7 is a flowchart of a method 700 for reading data from a memory cell, according to one embodiment. At 702, the method 700 includes storing a data value in a memory cell, according to one embodiment. At 704, the method 700 includes selecting the memory cell for a read operation, according to one embodiment. At 706, the method 700 includes outputting the data value to a bitline coupled to the memory cell, according to one embodiment. At 708, the method 700 includes sensing the data value from the bitline with a local I/O circuit coupled to the read that line, according to one embodiment. At 710, the method 700 includes providing the data value from the local I/O circuit to a global I/O circuit by selectively enabling the local I/O circuit, according to one embodiment. At 712, the method 700 includes sensing the data value with the global I/O circuit, according to one embodiment. At 714, the method 700 includes outputting the data value from the global I/O circuit, according to one embodiment.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
a memory cell configured to store a data value;
a plurality of bitlines each coupled to the memory cell;
a plurality of local I/O circuits each coupled to the memory cell by a respective bitline and including a first sensing stage configured to sense the data value from the bitline when the respective bitline is selected for a read operation; and
a plurality of global I/O circuits each coupled to a respective local I/O circuit and each including:
a respective global bitline that can be selectively coupled to receive the data value from the local I/O circuit coupled to the bitline selected for the read operation; and
a respective second sensing stage including an evaluation circuit configured to sense the data value output by the respective global bitline,
wherein the first sensing stage of each of the local I/O circuits includes a first inverter having an input coupled to the respective bitline,
wherein the respective second sensing stage includes a second inverter having an input coupled to the respective global bitline, and
wherein the first inverter is different from the second inverter.

2. The integrated circuit of claim 1, wherein each respective second sensing stage includes:
a first logic gate having:
a first input coupled to an output of the second inverter;
a second input configured to receive a first evaluation enable signal; and
an output coupled to an output of a respective one of the global I/O circuits.

3. The integrated circuit of claim 2, wherein each respective second sensing stage includes:
a second logic gate having:
a first input coupled to the output of the second inverter;
a second input configured to receive a second evaluation enable signal; and
an output coupled to the output of the respective one of the global I/O circuits.

4. The integrated circuit of claim 3, wherein the global I/O circuit includes a latch coupled to the outputs of the first and second logic gates.

5. The integrated circuit of claim 4, wherein the first logic gate is a NAND gate and the second logic gate is a NOR gate.

6. The integrated circuit of claim 1, wherein the first sensing stage includes a selection circuit coupled to an output of the first inverter and configured to selectively provide the data value to the respective global bitline responsive to a selection signal by inverting a signal output by the first inverter.

7. The integrated circuit of claim 6, wherein the selection circuit includes:
a first NMOS transistor having a gate terminal coupled to the output of the first inverter and a drain terminal coupled to the respective global bitline; and
a first PMOS transistor having a gate terminal coupled to the output of the first inverter and drain terminal coupled to the drain terminal of the first NMOS transistor.

8. The integrated circuit of claim 7, wherein the selection circuit includes:
a second NMOS transistor having a drain terminal coupled to a source terminal of the first NMOS transistor and a source terminal coupled to ground; and
a second PMOS transistor having a drain terminal coupled to a source terminal of the first PMOS transistor and a source terminal coupled to a high voltage supply.

9. An integrated circuit, comprising:
a memory array including a column separated into a first bank of memory cells and a second bank of memory cells;
a segmented bitline associated with the column of memory cells, the segmented bitline including a first bitline segment coupled to the first bank of memory cells and a second bitline segment coupled to the second bank of memory cells, the first bitline segment and the second bitline segment being discontinuous from each other;

a first local I/O circuit coupled to the first bitline segment and including a first sensing stage configured to sense a data value from a first memory cell of the first bank when the first memory cell is selected for a read operation;

a second local I/O circuit coupled to the second bitline segment and including a first sensing stage configured to sense a data value from a second memory cell of the second bank when the first memory cell is selected for the read operation; and a global I/O circuit coupled between the first local I/O circuit and the second local I/O circuit and including:

a global bitline that can be selectively coupled to receive the data value from the first local I/O circuit or the second local I/O circuit selected for the read operation; and a second sensing stage including an evaluation circuit configured to sense the data value output by the global bitline.

10. The integrated circuit of claim 9, wherein the memory array is an SRAM memory array.

11. The integrated circuit of claim 9, wherein the memory cells are multi-port memory cells.

12. The integrated circuit of claim 11, wherein the first sensing stage is configured to sense the data value from a selected memory cell by sensing the data value from a corresponding bitline.

13. The integrated circuit of claim 12, wherein the first sensing stage includes a first inverter having an input coupled to the bitline, wherein the second sensing stage includes a second inverter having an input coupled to the global bitline.

14. A method, comprising:

storing a data value in a memory cell coupled to a plurality of bitlines each coupled to a respective local I/O circuit, each local I/O circuit coupled to a respective global I/O circuit;

selecting the memory cell for a read operation;

outputting the data value to a selected bitline of the plurality of bitlines coupled to the memory cell;

sensing the data value from the selected bitline with the local I/O circuit coupled to the selected bitline, the local I/O circuit coupled to the selected bitline corresponding to a selected local I/O circuit, wherein each global I/O circuit includes:

a respective global bitline that can be selectively coupled to receive the data value from the respective local I/O circuit coupled to the bitline; and a respective second sensing stage including an evaluation circuit configured to sense the data value output by the respective global bitline, the global I/O circuit coupled to the selected local I/O circuit corresponding to a selected global I/O circuit, a first sensing stage of each of the local I/O circuits including a first inverter having an input coupled to the respective bitline, the respective second sensing stage including a second inverter having an input coupled to the respective global bitline, the first inverter being different from the second inverter;

providing the data value from the selected local I/O circuit to the global I/O circuit coupled to the selected local I/O circuit by selectively enabling the selected local I/O circuit;

sensing the data value with the selected global I/O circuit; and outputting the data value from the selected global I/O circuit.

15. The method of claim 14, wherein sensing the data value with the selected local I/O circuit includes inverting the data value with a first inverter of the selected local I/O circuit.

16. The method of claim 15, wherein providing the data value from the selected local I/O circuit to the selected global I/O circuit includes providing the data value from the selected local I/O circuit to a global bitline of the selected global I/O circuit.

17. The method of claim 16, wherein sensing the data value with the selected global I/O circuit includes inverting the data value from the global bitline.

18. The method of claim 14, further comprising:

discharging the selected bitline between every read operation by coupling the selected bitline to ground between every read operation; and keeping, between every read operation, the global bitline at a voltage corresponding to the data value of a most recent read operation.

* * * * *